(12) United States Patent
Tellkamp

(10) Patent No.: US 8,377,747 B2
(45) Date of Patent: Feb. 19, 2013

(54) INTERLEAF FOR LEADFRAME IDENTIFICATION

(75) Inventor: John Paul Tellkamp, Rockwall, TX (US)

(73) Assignee: Texas Instruments Incorporated, Dallas, TX (US)

( * ) Notice: Subject to any disclaimer, the term of this patent is extended or adjusted under 35 U.S.C. 154(b) by 323 days.

(21) Appl. No.: 12/870,181

(22) Filed: Aug. 27, 2010

(65) Prior Publication Data

US 2011/0263051 A1  Oct. 27, 2011

Related U.S. Application Data

(60) Provisional application No. 61/326,295, filed on Apr. 21, 2010.

(51) Int. Cl.
*H01L 21/44* (2006.01)
(52) U.S. Cl. ........ 438/111; 438/123; 438/652; 438/666; 257/E23.031
(58) Field of Classification Search .................. 438/111, 438/123, 652, 666
See application file for complete search history.

(56) References Cited

U.S. PATENT DOCUMENTS

| | | |
|---|---|---|
| 5,653,575 A | 8/1997 | Park et al. |
| 6,610,386 B2 | 8/2003 | Williams et al. |
| 8,026,127 B2 * | 9/2011 | Do et al. ............ 438/106 |
| 8,035,205 B2 * | 10/2011 | Park et al. ........... 257/667 |
| 2006/0131706 A1 * | 6/2006 | Corisis ............ 257/673 |
| 2007/0086644 A1 | 4/2007 | Wilson et al. |
| 2007/0240304 A1 | 10/2007 | Eisenhardt et al. |

FOREIGN PATENT DOCUMENTS

| | | |
|---|---|---|
| JP | 7022565 | 1/1995 |
| JP | 07022565 | 1/1995 |
| JP | 2001217259 A | 8/2001 |
| KR | 1020010103421 A | 11/2001 |

\* cited by examiner

*Primary Examiner* — Wai Sing Louie
(74) *Attorney, Agent, or Firm* — Steven A. Shaw; W. James Brady; Frederick J. Telecky, Jr.

(57) ABSTRACT

A method of making an IC device includes providing a stack of leadframe sheets each including a plurality of leadframes and an interleaf member interposed between adjacent ones of the leadframe sheets. The interleaf members include indicia that identifies the leadframes sheets. The stack of leadframe sheets is loaded onto an assembly machine. A first interleaf member is removed from the first leadframe sheet. The first leadframe sheet is transferred onto a mounting surface of the assembly machine. Semiconductor die are attached to leadframes on the first leadframe sheet. The method can include reading the indicia from the first interleaf member to determine a part number and lead finish for the first leadframe sheet, verifying the part number for the first leadframe sheet by comparing to a build list, and transferring the first leadframe sheet onto a mounting surface of the assembly machine only if the part number is verified.

12 Claims, 3 Drawing Sheets

INTERLEAF FOR LEADFRAME IDENTIFICATION

CROSS REFERENCE TO RELATED APPLICATIONS

This application and the subject matter disclosed herein claims the benefit of Provisional Application Ser. No. 61/326,295 entitled "LEADFRAME PART NUMBER IDENTIFICATION METHOD", filed Apr. 21, 2010, which is herein incorporated by reference in its entirety.

FIELD

Disclosed embodiments relate to assembly of integrated circuits (ICs), and more particularly to identification of leadframes during making of IC devices.

BACKGROUND

Semiconductor leadframes are generally supplied leadframe sheets (or "strips") stacked in a box. The leadframe sheets each comprise a plurality of leadframes, such as a sheet that is 10 leadframes wide by 20 leadframes long. The lid of the leadframe box typically includes a label that identifies the part number and lead finish associated with the leadframes. Between the respective leadframe sheets is commonly an interleaf provided for reinforcement to prevent tangling of the leadframe sheets. The interleaf can comprise a variety of materials including paper (e.g., lint-free paper), cardboard or a plastic film.

Assembly operations in a given assembly operation typically assemble a plurality of different die to a plurality of different leadframes. Leadframes of the same type (e.g., quad flat pack (QFP)) can have a variety of sizes (e.g., geometries) and arrangements, as well as a variety of different surface finishes.

Methods for ensuring that the proper leadframes are used in assembly include stamping or etching the part number on the side rails of the leadframe sheet. One problem with this method is the lead finish is added after the stamping or etching, and the lead finish later used may not be identifiable at the stamping or etching operation. Only part of the identification number (the mechanical design) is thus usually imprinted by stamping or etching the side rail of the leadframe sheet. Other problems associated with stamping or etching the side rail of the leadframe sheet include additional tooling being needed, and the possibility that the stamped or etched numbers can adversely affect the geometry (i.e., camber) of the leadframe sheets.

Ink printing after finishing the leadframes is another known method for leadframe identification. However, ink printing after finishing of the leadframes is not generally successful due to long drying times for inks on the metal leadframe surface. High speed printing (e.g., ink dot) inks do not stick well, or dry quickly enough on the metal leadframe surface to dry before stacking of the leadframe sheets to avoid smudging and resulting loss of discernable identifier information.

Accordingly, the part number is generally only printed on the lid of the leadframe box, which is separated from the stack of leadframes after the stack is loaded into the leadframe reservoir stack of the die mounter machine. A leadframe stack including leadframes from a plurality of leadframe boxes is generally placed in the reservoir stack of a die mounter at a given time for a given build operation.

Since identifiable part numbers (including its finish) are not printable on the leadframe sheet itself, mixing of leadframe part numbers, different finishes or leadframe sheets from different suppliers can be a problem. For example, during changeover at the die mounter, unused leadframe sheets in the mounter's reservoir stack are removed from the reservoir stack and returned to the leadframe box, which may no longer have its lid that has the part number identification information. Later use of these unused leadframe sheets can lead to mixing of leadframe part numbers, different finishes, or leadframe sheets from different suppliers.

SUMMARY

Disclosed embodiments describe methods of making an IC devices using interleaf members provided between adjacent leadframe sheets that including indicia that identifies the plurality of leadframes. Disclosed embodiments solve the problem of mixing of leadframe part numbers, different finishes or leadframe sheets from different suppliers during assembly, such as mixing caused by changeover at the assembly machine (e.g., die mounter machine) when unused leadframe sheets in the assembly machine's stack of leadframe sheets are removed from the reservoir stack and returned to the leadframe box as described above.

Disclosed methods generally include providing a stack of leadframe sheets each comprising a plurality of leadframes. A plurality of interleaf members include interleaf members that are interposed between adjacent leadframe sheets. The stack of leadframe sheets are loaded onto an assembly machine (e.g., die mounter machine). A first (e.g., top) interleaf member is removed from a first leadframe sheet. The first leadframe sheet is then transferred onto a mounting surface of the assembly machine. Semiconductor die are then attached to respective ones of the plurality of leadframes on the first leadframe sheet.

The indicia generally comprises at least one data identifier that identifies a part number associated with the leadframes. The method can include reading the data identifier from the interleaf member to determine a part number for the first leadframe sheet, verifying the part number on the first leadframe sheet by comparing to a build list for assembling the semiconductor die, and allowing the transferring and attaching to proceed only if the part number and optionally also the lead finish is verified as being correct. Significantly, disclosed interleaf members having indicia positioned between adjacent leadframe sheets in a stack of leadframe sheets allows identification of the leadframe stack to be retained throughout the consumption of the stack during the assembly process.

DETAILED DESCRIPTION

Figure 1A:
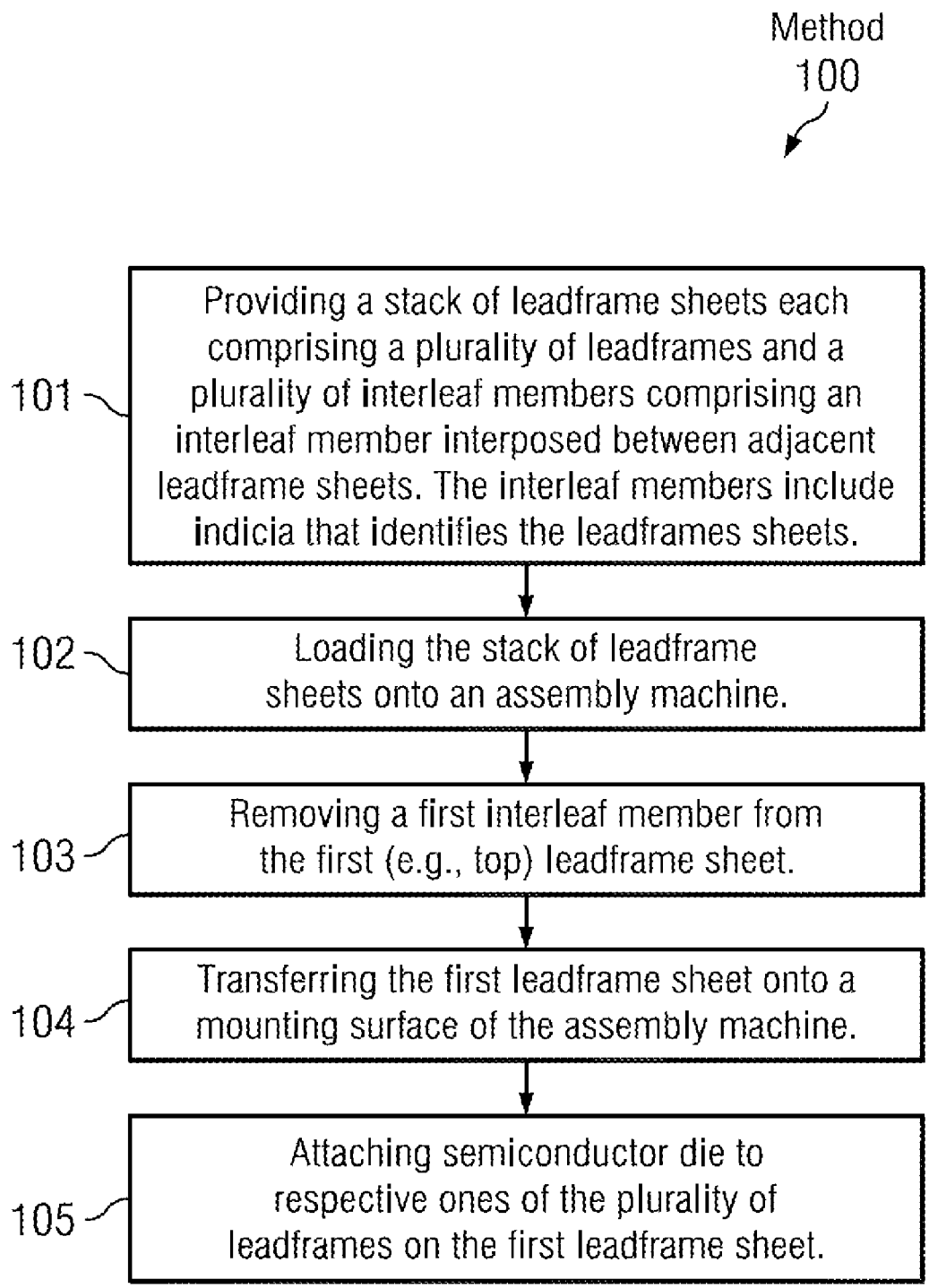
FIG. 1A is a flow chart showing steps in an exemplary method of making IC devices using interleaf members between the leadframe sheets in a stack of leadframe sheets that include indicia that identifies the leadframe sheets, according to an embodiment of the invention.

Disclosed embodiments in this Disclosure are described with reference to the attached figures, wherein like reference numerals are used throughout the figures to designate similar or equivalent elements. The figures are not drawn to scale and they are provided merely to illustrate the disclosed embodiments. Several aspects are described below with reference to example applications for illustration. It should be understood that numerous specific details, relationships, and methods are set forth to provide a full understanding of the disclosed embodiments. One having ordinary skill in the relevant art, however, will readily recognize that the subject matter disclosed herein can be practiced without one or more of the specific details or with other methods. In other instances, well-known structures or operations are not shown in detail to avoid obscuring structures or operations that are not well-known. This Disclosure is not limited by the illustrated ordering of acts or events, as some acts may occur in different orders and/or concurrently with other acts or events. Furthermore, not all illustrated acts or events are required to implement a methodology in accordance with this Disclosure.

Notwithstanding that the numerical ranges and parameters setting forth the broad scope of this Disclosure are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5.

FIG. 1A is a flow chart showing steps in an exemplary method 100 of making IC devices using interleaf members between the leadframe sheets in a stack of leadframe sheets that include indicia that identifies the leadframe sheets, according to an embodiment of the invention. Since the interleaf members provide the indicia, disclosed leadframe sheets are generally exclusive of any stamped or etched identifiers, which as described above can adversely affect the geometry (i.e., camber) of the leadframe sheets.

Disclosed embodiments can be applied to both leadless packages (e.g., quad flat package) and leaded packages. As defined herein, an interleaf member is a separator that is placed between layers of semiconductor leadframe sheets to provide support and separate the leadframe sheets to prevent tangling and protect the surface finishes.

Step 101 comprises providing a stack of leadframe sheets each comprising a plurality of leadframes and a plurality of interleaf members comprising an interleaf member interposed between adjacent leadframe sheets. The interleaf members include indicia that identifies the leadframes sheets so that that the identification of each leadframe sheet can be verified at any time throughout the consumption of the stack during the assembly process. Disclosed interleaf members can comprise a variety of materials including lint-free paper, cardboard or a plastic film. The interleaf members can be different weights (thicknesses), and be either "full" rectangles or have die cut openings for clearance between downset areas of the leadframe sheet. In a typical embodiment, the indicia is printed in ink on interleaf paper.

The indicia generally includes at least the part number (e.g., geometry) for the leadframe sheet, and in one embodiment also includes an identifier for its particular finish. The indicia can comprise one or more machine readable alpha numeric sequences or machine readable bar codes. In one embodiment the indicia comprises both a human readable format (e.g., a numerical sequence due to script variation around the world) and a machine readable alpha numeric sequence or a machine readable bar code.

Step 102 comprises loading the stack of leadframe sheets onto an assembly machine, such as a die mounting machine. Typically, leadframe sheets from a plurality of leadframe boxes are transferred by an operator into a single stack in the leadframe reservoir stack of the assembly machine.

Step 103 comprises removing a first interleaf member from the first (e.g., top) leadframe sheet. The first interleaf member is generally held to the top surface of the first leadframe sheet by gravity. The assembly machine generally picks up the leadframe from the top of the stack, which can be programmed to pickup and remove the interleaf member from the surface of the leadframe sheet. The pickup is typically performed by applying a vacuum on the side rail areas of the leadframe sheet.

Step 104 comprises transferring the first leadframe sheet onto a mounting surface of the assembly machine. Step 105 comprises attaching semiconductor die to respective ones of the plurality of leadframes on the first leadframe sheet.

Figure 1B:
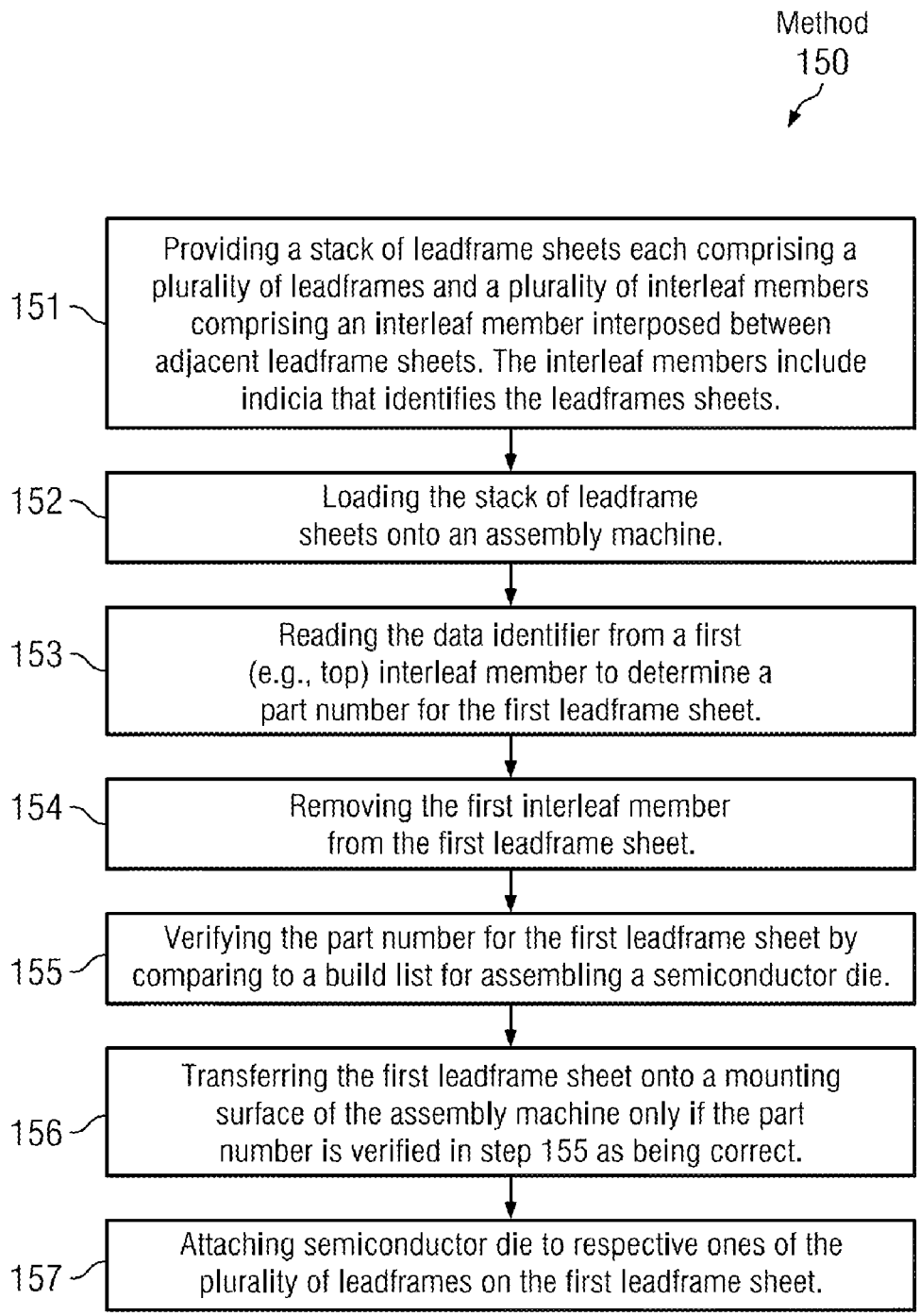
FIG. 1B is a flow chart showing steps in an exemplary method of making IC devices using interleaf members between the leadframe sheets in a stack of leadframe sheets that include indicia that identifies the leadframe sheets, according to another embodiment of the invention.

FIG. 1B is a flow chart showing steps in an exemplary method 150 of making IC devices using interleaf members between the leadframe sheets in a stack of leadframe sheets that include indicia that identifies the leadframe sheets, according to another embodiment of the invention. Steps 151 and 152 are the same as steps 101 and 102 described above for method 100. Step 153 comprises reading the data identifier from a first interleaf member to determine a part number for the first leadframe sheet. Step 154 follows step 103 in method 100 and comprises removing the first interleaf member from the first leadframe sheet.

Step 155 comprises verifying the part number for the first leadframe sheet by comparing to a build list for assembling a semiconductor die. As known in the art, the build list comprises an assembly "program" which is downloaded to the assembly machine that defines how the assembly machine is to operate for each device type before beginning each different assembly.

Step 156 comprises transferring the first leadframe sheet onto a mounting surface of the assembly machine only if the part number is verified in step 155 as being correct. Step 157 is the same as step 105 described above for method 100 and comprises attaching semiconductor die to respective ones of said plurality of leadframes on said first leadframe sheet.

In one embodiment the indicia printed on the interleaf member identifies both the part number and lead finish, and the assembly machine has a vision system to read the indicia from the interleaf to automatically verify the part number and lead finish of the leadframe sheet to the build list. This embodiment may involve modification to the assembly machine since although there is generally optical imaging and recognition for the die attach area of the machine, there is no optical imaging and recognition at the leadframe stack/interleaf location.

Figure 2:
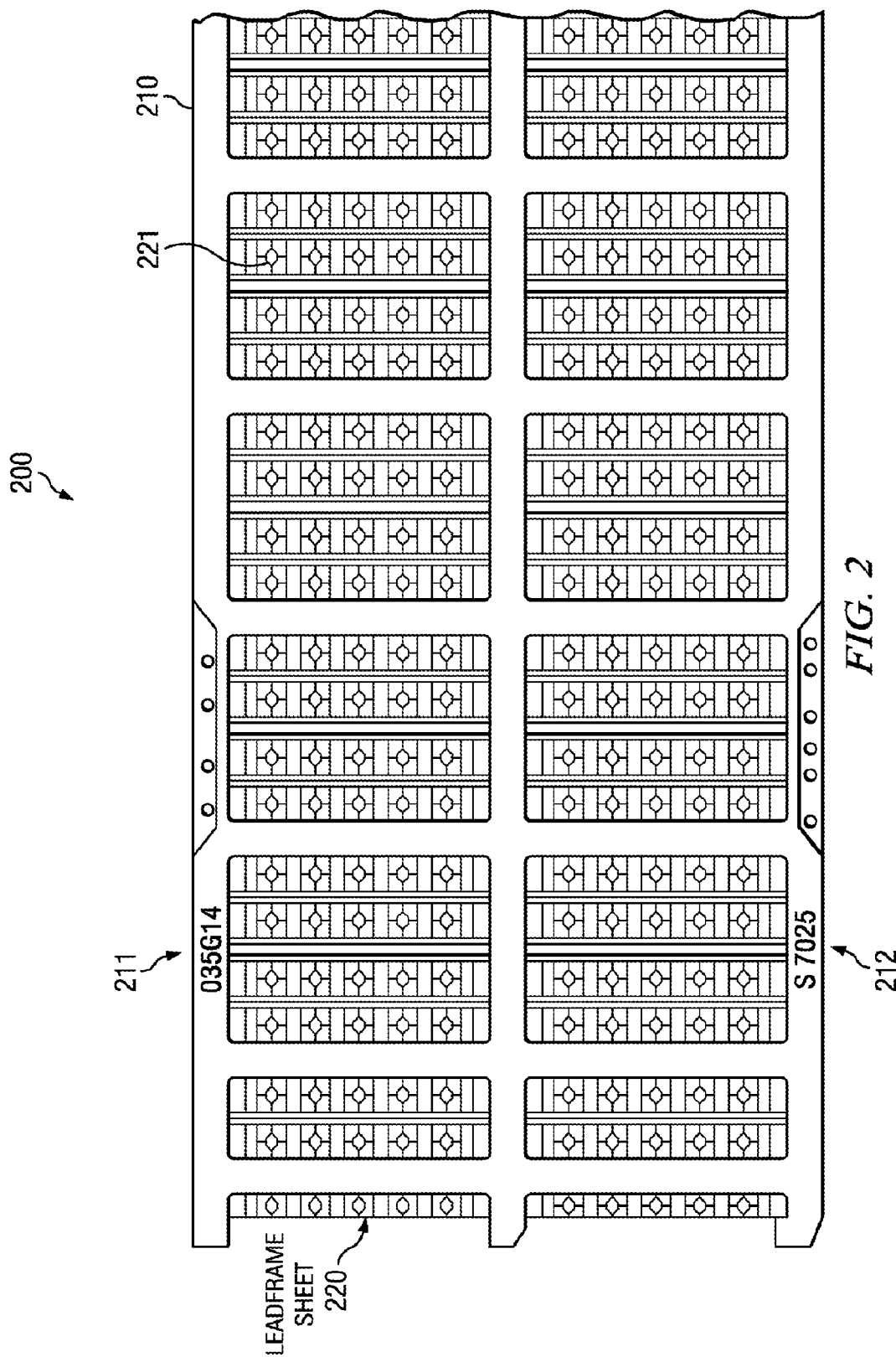
FIG. 2 is a depiction of an exemplary interleaf member having indicia comprising an alpha-numeric part number identifier on a lead frame sheet for identifying the leadframe part number, according to a disclosed embodiment.

FIG. 2 is a depiction 200 of an exemplary interleaf member 210 having indicia comprising alpha-numeric part number identifiers 211 and 212 on a lead frame sheet 220 comprising a plurality of leadframes 221 for identifying the lead frame part number and finish, according to a disclosed embodiment. Identifier 211 identifies the mechanical geometry, and identifier 212 identifies the finish (plating) and base metal (alloy). The characters can be large enough in size so that that the identifiers 211 and 212 are readable by an unaided individual in a manufacturing environment. As described above, the interleaf member 210 can be removed by the assembly machine where it can be verified by comparing the interleaf identifiers to the build list for the assembly lot.

Although interleaf member 210 shown in depiction 200 in FIG. 2 has die cut openings for clearance between downset areas of the leadframe sheet 220, disclosed interleaf members can be embodied as a "full" rectangles, such as for identifying non-downset leadframes.

Advantages of disclosed embodiments include the interleaf members being placed between the leadframe sheets at the end of the leadframe manufacturing process (cut and pack), thus being after the finish and final part number is known. In contrast, known stamping or etching the part number on the side rails of the leadframe sheet is done before finish so that side rail marking does not identify the finish, notwithstanding difficulties reading stamped or etched side rails. In addition, the printing on the interleaf members can be done by machine as the leadframe sheets are stacked because the ink for the identifier(s) will generally dry quickly particularly when the interleaf is embodied as paper so that no separate drying step is needed. Moreover, the interleaf member can be removed by the assembly (e.g., die mounter) machine where it can be automatically verified by comparing to the build list for the assembly lot.

Disclosed embodiments can be integrated into a variety of assembly flows to form a variety of different IC devices and related products. The IC assembly can comprise single semiconductor die or multiple semiconductor die, such as PoP configurations comprising a plurality of stacked die. A variety of package substrates may be used. The semiconductor die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the semiconductor die can formed from a variety of processes including bipolar, CMOS, BiCMOS and MEMS.

While various disclosed embodiments have been described above, it should be understood that they have been presented by way of example only, and not limitation. Numerous changes to the subject matter disclosed herein can be made in accordance with this Disclosure without departing from the spirit or scope of this Disclosure. In addition, while a particular feature may have been disclosed with respect to only one of several implementations, such feature may be combined with one or more other features of the other implementations as may be desired and advantageous for any given or particular application.

Thus, the breadth and scope of the subject matter provided in this Disclosure should not be limited by any of the above explicitly described embodiments. Rather, the scope of this Disclosure should be defined in accordance with the following claims and their equivalents.

The terminology used herein is for the purpose of describing particular embodiments only and is not intended to be limiting. As used herein, the singular forms "a," "an," and "the" are intended to include the plural forms as well, unless the context clearly indicates otherwise. Furthermore, to the extent that the terms "including," "includes," "having," "has," "with," or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which embodiments of the invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

I claim:

1. A method of making an integrated circuit (IC) device, comprising:
   providing a stack of leadframe sheets each comprising a plurality of leadframes and a plurality of interleaf members including an interleaf member interposed between adjacent ones of said leadframe sheets, said plurality of interleaf members including indicia that identifies said leadframes sheets;
   loading said stack of leadframe sheets onto an assembly machine;
   removing a first interleaf member from said first leadframe sheet;
   transferring said first leadframe sheet onto a mounting surface of said assembly machine, and
   attaching semiconductor die to respective ones of said plurality of leadframes on said first leadframe sheet.

2. The method of claim 1, wherein said indicia comprises at least one data identifier that identifies a part number associated with said leadframe sheets, further comprising:
   reading said data identifier from said first interleaf member to determine a part number for said first leadframe sheet;
   verifying said part number for said first leadframe sheet by comparing to a build list for assembling said semiconductor die, and
   allowing said transferring and said attaching only if said part number is verified as being correct.

3. The method of claim 2, wherein said data identifier also identifies a finish texture for said leadframe sheets, and wherein said reading said identifier comprises determining said part number and said finish texture, and said verifying comprises verify both said part number and said finish texture.

4. The method of claim 2, wherein said reading comprises at least one of human reading and reading by said assembly machine.

5. The method of claim 2, wherein said assembly machine comprises a pattern recognition system, and wherein before said reading said assembly machine picks up said first leadframe sheet and said first interleaf member, and said first interleaf member is then removed from first leadframe sheet by said assembly machine, wherein said reading is performed by said assembly machine.

6. The method of claim 1, wherein said indicia comprises a machine readable alpha numeric sequence or a machine readable bar code.

7. The method of claim 1, wherein said indicia comprises both a human readable format and a machine readable alpha numeric sequence or a machine readable bar code.

8. The method of claim 7, wherein said human readable format comprises a numerical sequence.

9. The method of claim 1, wherein said leadframe sheets include downset areas and said plurality of interleaf members have die cut openings for clearance between said downset areas of said leadframe sheets.

10. The method of claim 1, wherein said leadframe sheets excludes downset areas, and wherein said wherein said plurality of interleaf members comprise full sheets that exclude openings.

11. The method of claim 1, wherein said removing, said transferring and said attaching are performed exclusively by said assembly machine and are fully automatic steps.

12. The method of claim 1, wherein said leadframe sheets are exclusive of any stamped or etched identifiers.

* * * * *